US010128361B2

(12) United States Patent
De-Michielis et al.

(10) Patent No.: US 10,128,361 B2
(45) Date of Patent: Nov. 13, 2018

(54) INSULATED GATE POWER SEMICONDUCTOR DEVICE AND METHOD FOR MANUFACTURING SUCH A DEVICE

(71) Applicant: ABB Schweiz AG, Baden (CH)

(72) Inventors: Luca De-Michielis, Aarau (CH); Chiara Corvasce, Bergdietikon (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/661,631

(22) Filed: Jul. 27, 2017

(65) Prior Publication Data

US 2017/0323959 A1 Nov. 9, 2017

Related U.S. Application Data

(63) Continuation of application No. PCT/EP2016/050425, filed on Jan. 12, 2016.

(30) Foreign Application Priority Data

Jan. 27, 2015 (EP) .................................... 15152658
Feb. 25, 2015 (EP) .................................... 15156536

(51) Int. Cl.
*H01L 29/66* (2006.01)
*H01L 29/739* (2006.01)
(Continued)

(52) U.S. Cl.
CPC ...... *H01L 29/7397* (2013.01); *H01L 21/2253* (2013.01); *H01L 29/0623* (2013.01); *H01L 29/0834* (2013.01); *H01L 29/66348* (2013.01)

(58) Field of Classification Search
CPC ............. H01L 21/2253; H01L 29/0834; H01L 29/66348; H01L 29/7397
(Continued)

(56) References Cited

U.S. PATENT DOCUMENTS

| 6,570,185 B1 | 5/2003 | Tan |
| 2011/0233728 A1 | 9/2011 | Chiola et al. |

(Continued)

FOREIGN PATENT DOCUMENTS

| EP | 0795911 A2 | 9/1997 |
| EP | 0795911 A3 | 10/1998 |
| JP | 2010232627 A | 10/2010 |

OTHER PUBLICATIONS

European Search Report EP15156536, dated Jun. 19, 2015, ABB Technology AG, 9 pages.
(Continued)

*Primary Examiner* — Long K Tran
(74) *Attorney, Agent, or Firm* — J. Bruce Schelkopf; Taft Stettinius & Hollister LLP

(57) ABSTRACT

An insulated gate power semiconductor device has an (n−) doped drift layer between an emitter side and a collector side. A trench gate electrode has a trench bottom and trench lateral sides and extends to a trench depth. A p doped first protection pillow covers the trench bottom. An n doped second protection pillow encircles the trench gate electrode at its trench lateral sides. The second protection pillow has a maximum doping concentration in a first depth, which is at least half the trench depth, wherein a doping concentration of the second protection pillow decreases towards the emitter side from the maximum doping concentration to a value of not more than half the maximum doping concentration. An n doped enhancement layer has a maximum doping concentration in a second depth, which is lower than the first depth, wherein the doping concentration has a local doping concentration minimum between the second depth and the first depth.

20 Claims, 10 Drawing Sheets

(51) Int. Cl.
*H01L 29/06* (2006.01)
*H01L 29/08* (2006.01)
*H01L 21/225* (2006.01)

(58) Field of Classification Search
USPC .................. 438/238, 239, 250; 257/139, 262
See application file for complete search history.

(56) References Cited

U.S. PATENT DOCUMENTS

| | | |
|---|---|---|
| 2014/0159144 A1 | 6/2014 | Cheng |
| 2014/0312383 A1 | 10/2014 | Song et al. |
| 2015/0155380 A1* | 6/2015 | Schulze .............. H01L 29/0649 257/330 |

OTHER PUBLICATIONS

International Search Report and Written Opinion, PCT/EP2016/050425, dated Apr. 5, 2017ABB Technology AG, 11 pages.

* cited by examiner

US 10,128,361 B2

INSULATED GATE POWER SEMICONDUCTOR DEVICE AND METHOD FOR MANUFACTURING SUCH A DEVICE

TECHNICAL FIELD

The invention relates to the field of power electronics, and more particularly to a method for manufacturing an insulated gate power semiconductor device according to the independent claim 1 or to a device as such according to the preamble of the independent claim 8.

BACKGROUND ART

In FIG. 1 a prior art insulated gate bipolar transistor (IGBT) is shown as known from EP 0 795 911 A2. The prior art device comprises an active cell with layers of different conductivity types in the following order between an emitter electrode 2 on an emitter side 22 and a collector electrode 25 on a collector side 27 opposite to the emitter side 22: an (n+) doped source layer 3, a p doped base layer 4, which contacts the emitter electrode 25, an n doped enhancement layer 95, an (n−) doped drift layer 5, an (n+) doped buffer layer 55 and a p doped collector layer 6.

A trench gate electrode 7 is arranged on the emitter side 22, which comprises a gate layer 70 and a first electrically insulating layer 72, which surrounds and thus separates the gate layer 70 from the drift layer 5, base layer 4 and the source layer 3. A second insulating layer 74 is arranged between the gate layer 70 and the emitter electrode 2. The trench gate electrode 7 extends from the emitter side 22 up to a trench depth 77, at which a trench bottom 76 is arranged, which has trench lateral sides 75 extending from the trench bottom 76 to the emitter side 22. A p doped first protection pillow 8 covers the trench bottom 76.

As described in EP 0 795 911 A2 the prior art device is created by first implanting and diffusing an N-dopant for the creation of the enhancement layer 95. The enhancement layer 95 has a higher doping concentration than the drift layer 5. Afterwards, a P-dopant is implanted and diffused for creating the p doped base layer 4. The n+ source layer 3 is then created by implanting and diffusing an N-dopant using a resist mask. Subsequently, an oxide film is applied over the source layer 3 and partly over the base layer 4 for etching openings for the trench gate electrodes 7, which extend in depth direction down to the drift layer 5. Now a P dopant is implanted in the bottom of the trench. Then the oxide film is etched away and a thermal oxide film (for forming the insulating layer 72) is formed on the surface of the trenches, which are then filled with polysilicon doped with N-impurities for creating an electrically conductive gate layer 70. The polysilicon is etched back to the openings of the trenches, leaving the polysilicon buried in the trenches. Then the surface is covered by a second insulating layer 74, which is afterwards covered by a resist layer as another mask, which covers the regions on top of the trenches, the source regions 3 besides a small open area, which lies directly adjacent to the base layer 4 which is also uncovered. The second insulating layer 74 is then etched away at the uncovered resist mask areas, thus maintaining the second insulating layer 74 on top of the gate layer 70 and the adjacent part of the source layer 3. Afterwards AlSi is applied on the uncovered areas of the second insulating layer 74, by which AlSi layer, which forms the emitter electrode 2, the base layer 4 and source layer 3 are shorted.

The n-type enhancement layer 95 improves the PIN effect, increases the plasma concentration and lowers the on-state losses. However, such a prior art device having a highly doped enhancement layer 95 will suffer from worse SOA and breakdown voltage compared to standard trench IGBTs. As the carrier concentration near the active cell is enhanced by such an enhancement layer 95, IGBTs with such an enhancement layer 95 are superior compared to prior art IGBTs having no enhancement layer in view of higher safe operating area (SOA) and lower on-state losses.

However, the electric field at the n-enhancement/p-base junction 95, 4 also increases. Practical enhancement layer doping concentrations are therefore limited to values smaller than $2.5*10^{16}$ cm$^{-3}$ to prevent excessive electric fields and therefore degradation of the blocking performance and turn-off SOA. As shown in FIG. 3, the on-state voltage $V_{CE,on}$ advantageously decreases for higher doping concentrations. That means for the breakdown voltage, the lower the doping concentration of the enhancement layer the better, and for the on-state voltage vice versa with an upper limit of the doping concentration at the point at which the breakdown voltage collapses.

The enhancement layer allows for a remarkable reduction of the on-state ($v_{CE,on}$) and its benefits are even more important for larger doping concentrations of the enhancement layer ($N_{D,enh}$). However, the larger the enhancement doping concentration is, the lower is the breakdown voltage ($V_B D$) that the IGBT is able to sustain.

FIG. 4 shows data for different prior art devices. Device 1 is a trench IGBT having a maximum doping concentration in the enhancement layer 95 of $2*10^{16}$ cm$^{-3}$ and no first protection pillow. Device 2 differs from device 1 by having a first p doped protection pillow 8. Device 3 is a trench IGBT having a maximum doping concentration in the enhancement layer 95 of $1*10^{17}$ cm$^{-3}$ and no first protection pillow, and device 4 differs from device 3 by having a first p doped protection pillow 8. In all figures, in which device 1-4 are mentioned, the devices shall be the devices with the features mentioned above.

The impact ionization effect, responsible for the detrimental degradation of the IGBT devices, is normally taking place at the trench bottom. However, in a device with an increased enhancement doping concentration (larger than $2.5*10^{16}$ cm$^{-3}$) the avalanche generation takes place at the interface between the p-body and the n-enhancement regions. In order to be able of exploiting the on-state benefits of a highly doped enhancement layer, without suffering from the drawbacks of reduced RBSOA capabilities, a first p doped protection pillow 8 has been introduced in EP 0 795 911 A2. The first protection pillow 8 reduces the high electric field at the trench bottom, which have been created due to the introduction of the enhancement layer 95, so that the reverse blocking SOA and breakdown voltage VBD is improved. This is shown in FIG. 4, in which both devices having a first protection pillow 8 have an improved $V_B D$, but worser VCE,OR. Nevertheless, the introduction of p doped first protection pillows at the trench bottoms improves the device robustness, being able to postpone the onset of the breakdown mechanism, but is not able to redeem the inherent weakness of a trench IGBT device sufficiently where the impact ionization is caused by increased enhancement doping concentration.

This is the case, because for devices with larger enhancement doping concentration levels, when the breakdown conditions are fulfilled the avalanche generation still takes place at the n-enhancement/p-base layer boundary, with a relevant amount of generated carriers near the Silicon/gate oxide (first insulating layer 72) interface. This potentially translates in unwanted drawbacks such as hot carrier injection in the gate oxide with consequent threshold voltage instabilities. Eventually, this device also shows a degraded dynamic avalanche robustness, and this phenomena is even more exacerbated under hard switching conditions as shown in FIG. 5.

Introduction of a first protection pillow to a prior art device having an enhancement layer of increased maximum doping concentration (i.e. above 2.5 or $3*10^{16}$ cm$^{-3}$) leads to a great improve on the breakdown voltage, but still this values stays much lower than for a device without first protection pillow and lower enhancement doping concentration (i.e. below $2.5*10^{16}$ cm$^{-3}$).

The p first protection pillow improves the breakdown robustness at the price of an increased on-state. However the weakness of avalanche generation at the enhancement/channel interface is present in the prior art device 4 with increased $N_{D^{enh}}$ (FIG. 5). The hard switching turn off behavior of a prior art trench IGBT (dashed lines in the figure) and the Trench with increased maximum doping concentration in the enhancement layer and p+ first protection pillow 8 (alternating dashed/dotted lines in the figure) is shown in FIG. 5. Device 4 suffers from larger dynamic avalanche, as shown from the larger bending trend of the curves under hard switching conditions.

JP 2010 232627 A concerns a method for creating a trench IGBT. First a trench is etched into a substrate, which is then filled with an Arsenic epitaxial layer as n dopant. A heat treatment is performed, thereby creating a diffused epitaxial layer, which has a constant doping concentration along the lateral sides of the trench in depth direction. Afterwards the trench depth is increased and Boron is implanted and diffused at the deepened trench bottom.

US 2011/233728 A1 describes a manufacturing method for an IGBT, in which a trench recess is etched into a drift layer, at the bottom an n dopant is implanted and diffused to form a contiguous layer as one n dopant layer. Afterwards, a p dopant is implanted in the same trench recess to form a protection region at the trench bottom, which is embedded in the enhancement layer.

DISCLOSURE OF INVENTION

It is an object of the invention to provide a power semiconductor device, which simultaneously has low on-state losses and high breakdown voltage, compared to prior art devices.

This object is achieved by providing an inventive power semiconductor device comprising:
an emitter electrode on an emitter side and a collector electrode on a collector side, which collector side is arranged opposite to the emitter side,
a drift layer of a first conductivity type, which is arranged between the emitter side and the collector side,
a base layer of a second conductivity type, which is different from the first conductivity type, which base layer is arranged between the drift layer and the emitter side, and which base layer contacts the emitter electrode,
a source layer, which is arranged on the emitter side, which is separated from the drift layer by the base layer and which contacts the emitter electrode,
a trench gate electrode, which comprises an electrically conductive gate layer and a first electrically insulating layer, which surrounds and thus separates the gate layer from the drift layer, the base layer and the source layer, which trench gate electrode has a trench bottom and trench lateral sides and which trench gate electrode extends from the emitter side up to a trench depth,
a first protection pillow of the second conductivity type, which covers the trench bottom,
a second protection pillow of the first conductivity type having higher doping concentration than the drift layer, which encircles the trench gate electrode at the trench lateral sides and which second protection pillow has a maximum doping concentration in a first depth, which is at least half the trench depth, wherein a doping concentration of the second protection pillow decreases towards the emitter side from the maximum doping concentration to a value of not more than half the maximum doping concentration of the second protection pillow, and
an enhancement layer of the first conductivity type having higher doping concentration than the drift layer, which separates the base layer from the drift layer, wherein the enhancement layer has a maximum doping concentration in a second depth, which is lower than the first depth and wherein the doping concentration has a local doping concentration minimum between the second depth and the first depth.

The n doped second protection pillow acts as a sort of enhancement layer and to provide the benefits of plasma enhancement without the drawbacks of premature avalanche generation and hot carrier injections in the gate oxide (first insulating layer), as it could happen in a device with increased doping concentration in an enhancement layer. The role of the p doped first protection pillow is to protect the second protection pillow from the incoming electric field, thereby delaying the onset of impact ionization and increasing in this way the robustness of the device.

The inventive semiconductor device is able to combine together the advantages of lower on-state, increased RBSOA and reduced risk of hot carrier injection in the gate oxide (first insulating layer). As a result of the reduced risk of hot carrier injection in the channel gate oxide at the enhancement layer/channel interface, the device reliability is improved.

Furthermore, the plasma concentration may be increased in the inventive device, which means reduced on-state losses, without the drawbacks of an enhancement layer having increased doping concentration, which means lower breakdown voltage. As shown in FIG. 6, the on state voltage $V_{CE,on}$ may lowered by about 10% for the same breakdown voltage.

As shown in FIG. 6, the inventive device is able to combine the advantages of an increased robustness against breakdown avalanche without any on-state loss, i.e. even with an improvement on on-state losses (i.e. lower $V_{CE,on}$) compared to prior art devices. A much more aggressive reduction of the on-state losses may also be achieved with a slight reduction of the breakdown voltage.

Also in this case the avalanche breakdown mechanism still takes place at the trench bottom and not at the touchy enhancement/base layer interface, as it happens in a device with increased enhancement doping concentration. Therefore, no threshold voltage degradation takes place in the inventive device, due to absence of hot electron injection in the gate oxide region near the p-base layer area.

Furthermore, the RBSOA is increased in the inventive device due to the introduction of the first protection pillow. The augmented RBSOA capability and the improved robustness against dynamic avalanche are also shown in FIG. 7. In FIG. 8 the doping concentrations of the layers are shown as a doping profile in depth direction (direction perpendicular to the emitter side 22) along the line A-A of FIG. 2. The continuous line shows the net doping concentration of the donor ND-NA (n doping) and the dotted line shows the net doping concentration of the acceptor $N_A$-ND.

FIG. 9 shows the doping concentration in a direction parallel to the emitter side 22 in such a depth, in which the second protection pillow 9 has its maximum doping concentration (along line B-B of FIG. 2) for a device having a plurality of trench gate electrodes 7 and a plurality of first and second protection pillows 8, 9. This figure shows that the two neighboured second protection pillows 9 may overlap such that the doping concentration of the second protection pillows 9 in a direction parallel to the emitter side 22 drops to a local minimum doping concentration (which for overlapping second protection pillows 9 is still higher than the doping concentration of the drift layer 5), wherein the local minimum doping concentration lies at the midpoint between the two neighboured trench gate electrodes 7.

FIG. 10 shows the doping concentration in a direction parallel to the emitter side 22 in such a depth, in which the first protection pillow 8 is arranged and in which the trench gate electrode 7 (along line C-C of FIG. 2) for a device having a plurality of trench gate electrodes 7 and a plurality of first and second protection pillows 8, 9. This figure shows that the two neighboured second protection pillows 9 may overlap such that the doping concentration of the second protection pillows 9 in a direction parallel to the emitter side 22 drops to a local minimum doping concentration (which for overlapping second protection pillows 9 is still higher than the doping concentration of the drift layer 5), wherein the local minimum doping concentration lies at the midpoint between the two neighboured trench gate electrodes 7.

Furthermore, the inventive device has the advantage that the collector-emitter voltage $V_CE$ rises with the same slope as the prior art device having no first protection pillow.

More specifically, FIG. 7 shows the maximum value of the avalanche generation during the turn-off switching of a Trench IGBT device in nominal condition for 1.8 kV devices. Also in this perspective, the inventive device shows remarkable advantages if compared with prior art 3.3 kV Trench IGBT without first protection pillow, by eliminating the peak of avalanche generation registered during the voltage overshoot. Also the prior art device with increased maximum doping concentration and first protection pillow shows a much higher avalanche generation than the inventive device.

With the structure, a more aggressive reduction of the on-state can be achieved without any risk of avalanche generation at the enhancement/channel interface (FIG. 7) as it could happen instead in a device with increased enhancement doping.

BRIEF DESCRIPTION OF DRAWINGS

The subject matter of the invention will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the invention.

MODES FOR CARRYING OUT THE INVENTION

Figure 1:
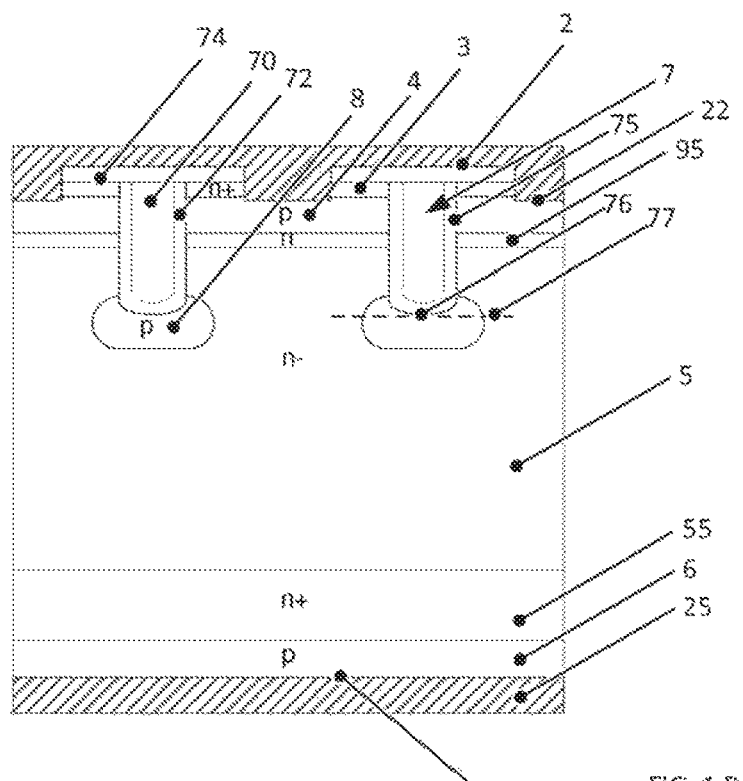
FIG. 1 shows a prior art insulated gate semiconductor device with a trench gate electrode having an enhancement layer and a first protection pillow.
Figure 2:
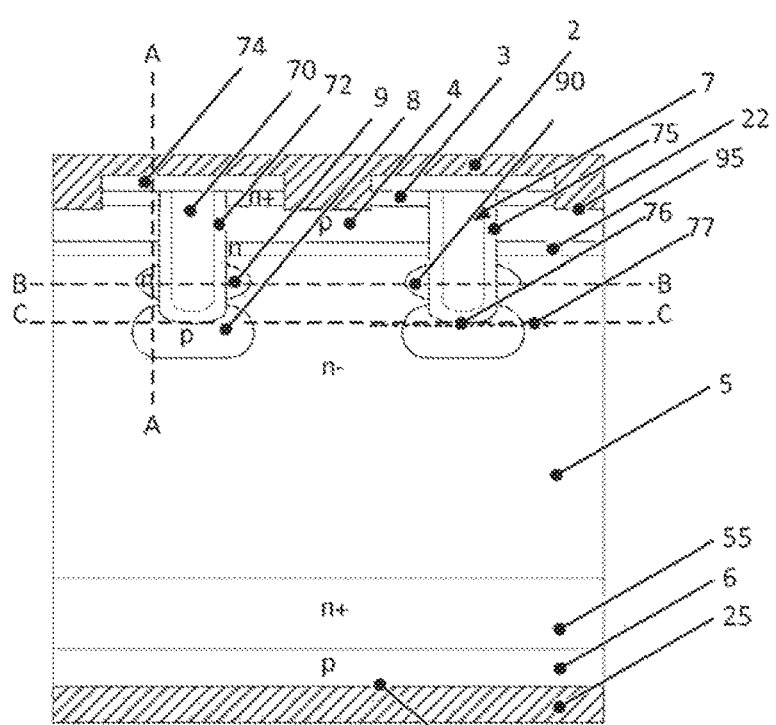
FIG. 2 shows an inventive insulated gate semiconductor device with a trench gate electrode having a first and second protection pillow together with an enhancement layer.
Figure 3:
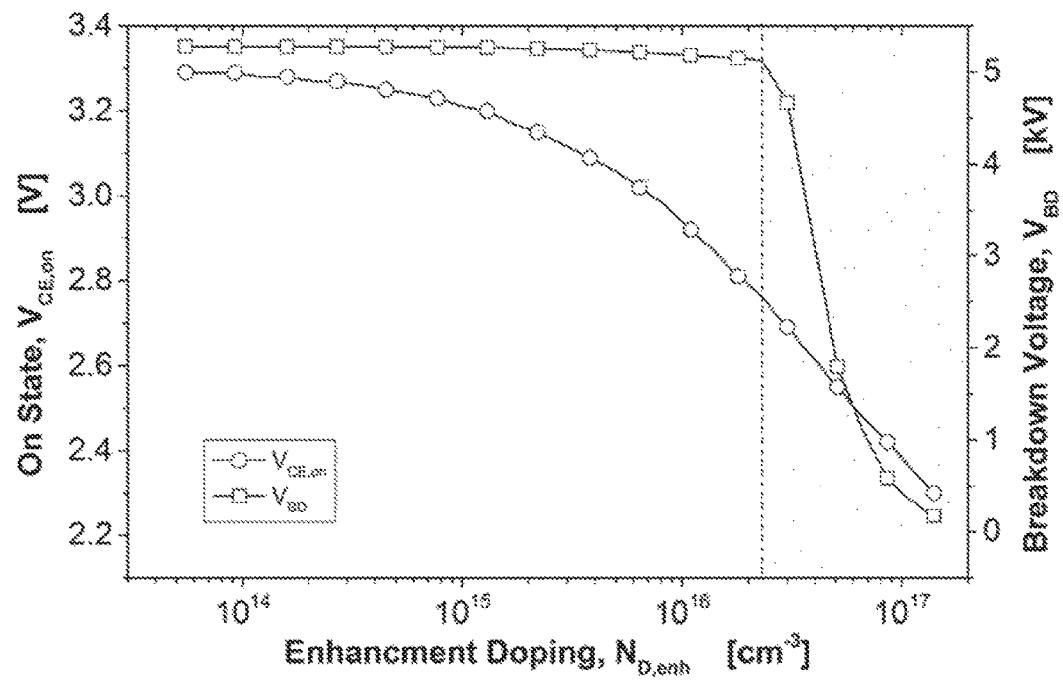
FIG. 3 shows breakdown voltage $V_{bd}$ versus the collector-emitter voltage VCE, on for prior art devices having an enhancement layer in dependence of the maximum doping concentration of the enhancement layer.
Figure 4:
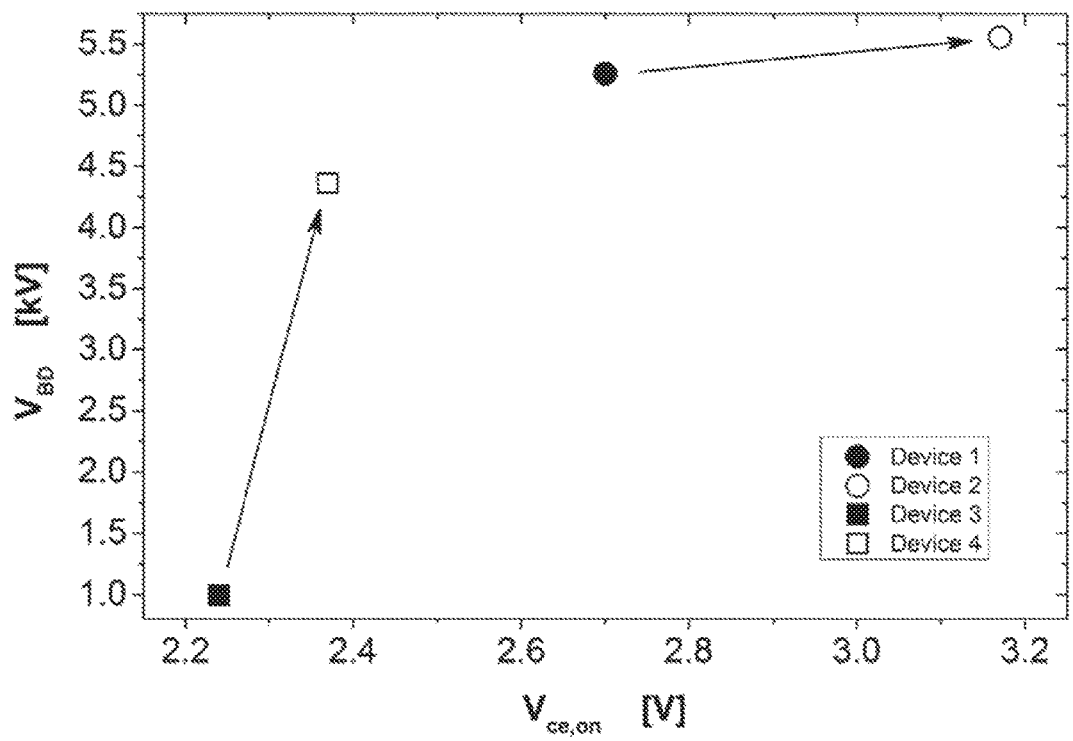
FIG. 4 shows breakdown voltage $V_{bd}$ versus the collector-emitter voltage VCE, on for a different prior art devices.
Figure 5:
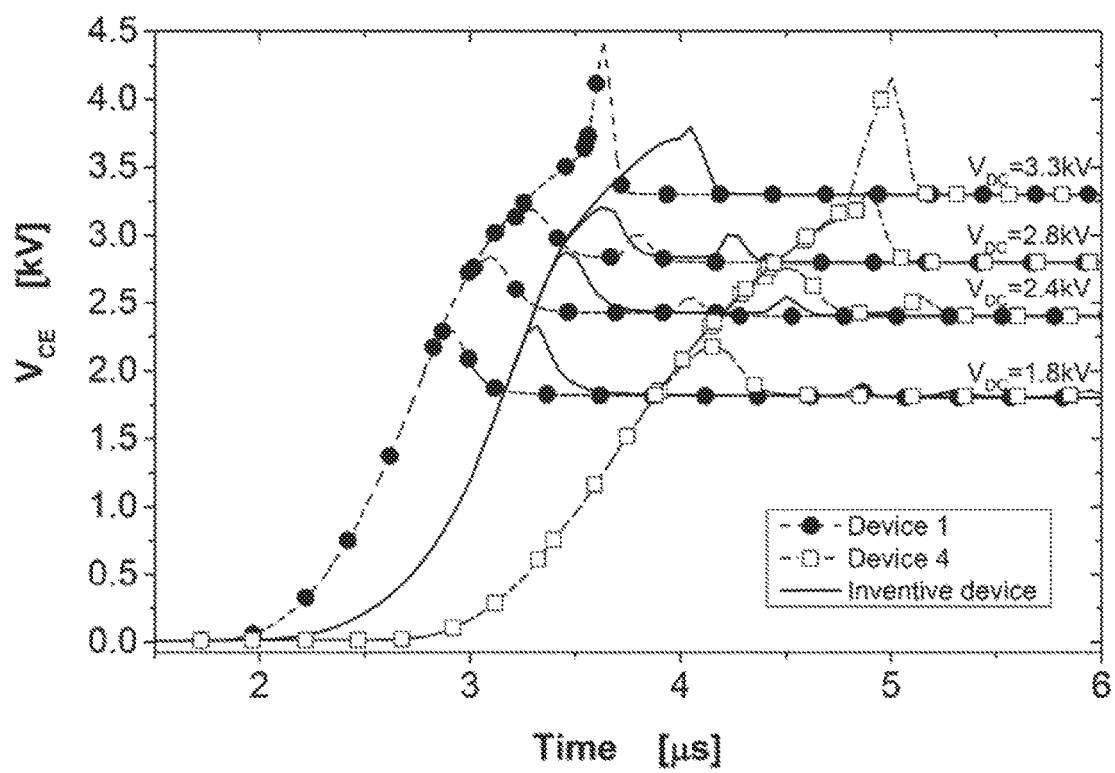
FIG. 5 shows VCE. on versus time for different prior art devices having an enhancement layer with a maximum doping concentration of $2*10^{16}$ cm$^{-3}$ (dashed line) and of a device with maximum enhancement doping concentration of $1*10^{17}$ cm$^{-3}$ together with a first protection pillow (alternating dashed/dotted line) and an inventive device having an enhancement layer and first and second protection pillows with the doping concentrations as shown in the FIGS. 8 to 10.
Figure 6:
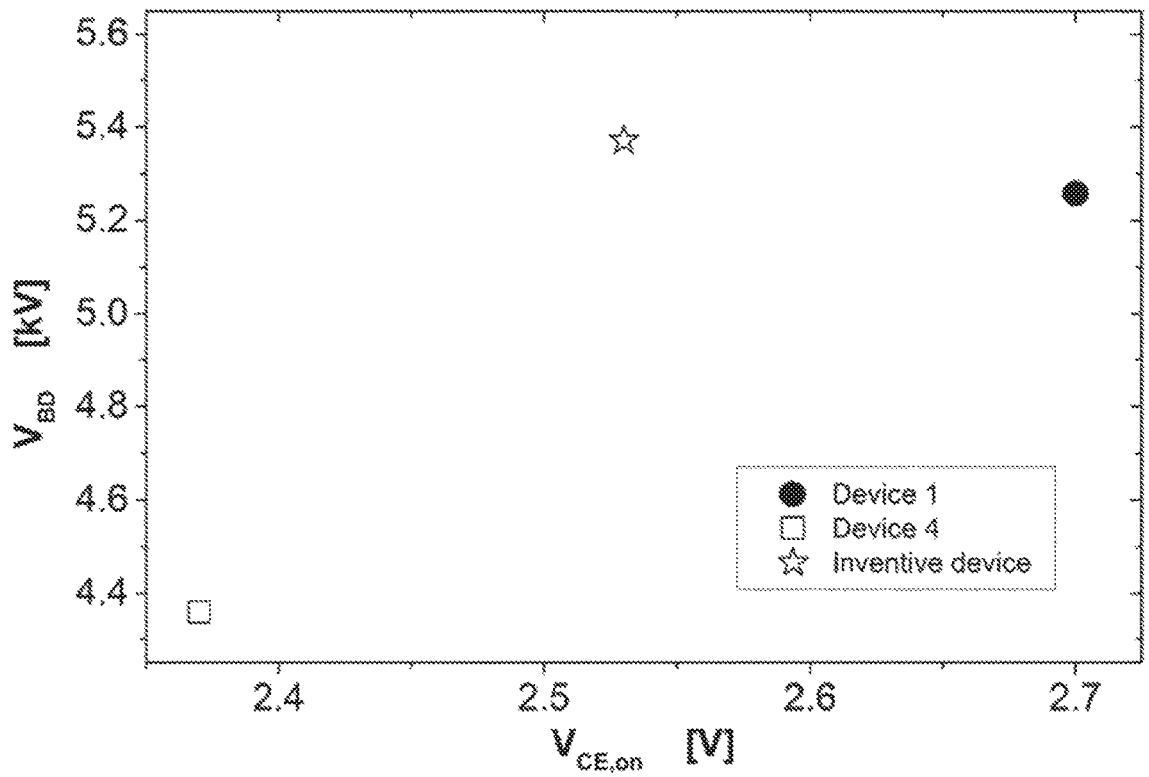
FIG. 6 shows breakdown voltage $V_{bd}$ versus the collector-emitter voltage VCE, on for a prior art devices and inventive devices.
Figure 7:
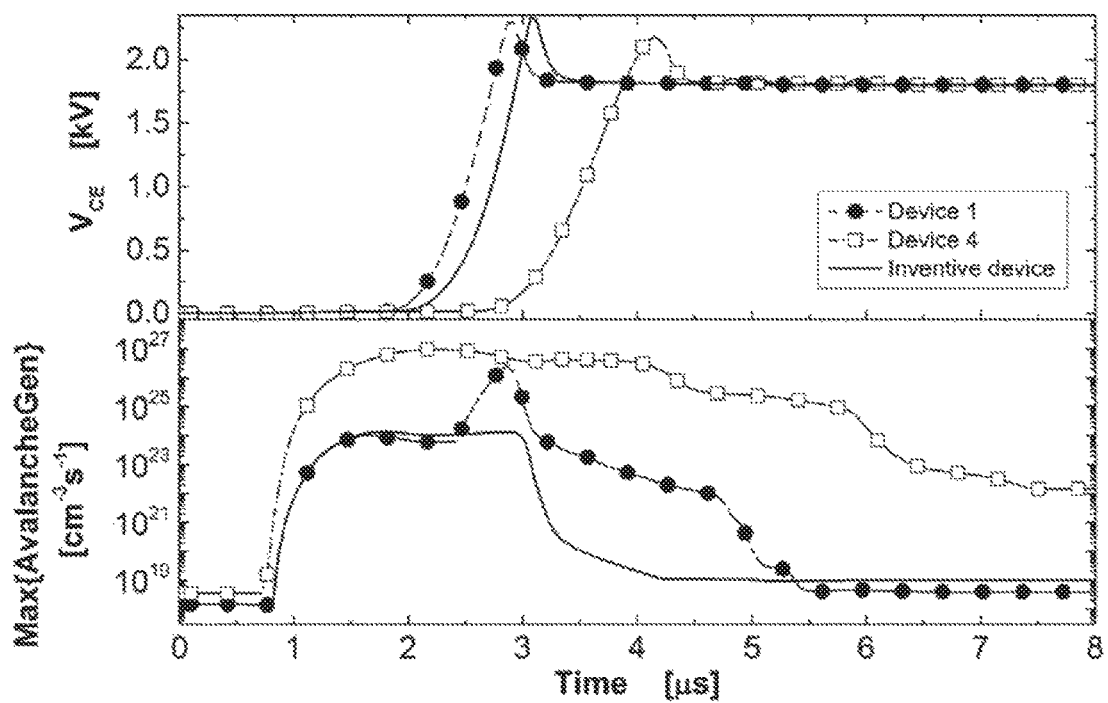
FIG. 7 shows VCE and maximum avalanche generation versus time.

In FIG. 2 an inventive insulated gate power semiconductor device is shown in form of an insulated gate bipolar transistor 1, which comprises an emitter electrode 2 on an emitter side 22 and a collector electrode 25 on a collector side 27, which collector side 27 is arranged opposite to the emitter side 22. An (n−) doped drift layer 5 is arranged between the emitter side 22 and the collector side 27. A p doped bass layer 4 is arranged between the drift layer 5 and the emitter side 22. The base layer 4 contacts the emitter electrode 2. At least one n doped source layer 3 is arranged on the emitter side 22. The source layer 3, which is separated from the drift layer 5 by the base layer 4, contacts the emitter electrode 2. The source layer 3 may be arranged such that a source layer 3 is arranged at both sides of each gate electrode.

The device comprises at least one trench gate electrode 7, which has an electrically conductive gate layer 70 and a first electrically insulating layer 72, which surrounds and thus separates the gate layer 70 from the drift layer 5, the base layer 4 and the source layer 3. Exemplarily, a second insulating layer 74 is arranged between the gate layer 70 and the emitter electrode 2 and insulates these electrodes 70, 2 from each other. The trench gate electrode 7 extends form the emitter side 22 to the drift layer 5. It is arranged lateral to the base layer 4 in a plane parallel to the emitter side 22. The trench gate electrode has a trench bottom 76 on a side opposite to the emitter side 22 and trench lateral sides 75 between the trench bottom 76 and the emitter side 22, exemplarily perpendicular to the emitter side 22. The trench gate electrode 7 extends from the emitter side 22 up to a trench depth 77. In an exemplary embodiment, the trench depth 77 is between 5 to 9 μm deep, exemplarily between 6 to 8 μm.

On the collector side 27 a p doped collector layer 6 is arranged. An n doped buffer layer 55 having higher doping concentration than the drift layer 5 may be arranged between the drift layer 5 and the collector layer 6.

At the trench bottom 76, a first p doped protection layer in form of a first protection pillow 8 is arranged such that it covers the trench bottom 76. That means that the trench bottom 76 is separated from the drift layer 5 by the first protection pillow 9. Also the edges between the trench bottom 76 and the trench lateral sides 75 may be covered by the first protection pillow 8. The first protection pillow 8 has a higher maximum doping concentration than the drift layer 5. It may also have a higher maximum doping concentration than the second protection pillow 9 disclosed below. The first protection pillow 8 is in contact to the lowly doped drift layer 5 in depth direction.

An n doped second protection layer in form of a second protection pillow 9 having higher doping concentration than the drift layer 5 encircles the trench gate electrode 7 in a plane parallel to the emitter side 22, i.e. at the trench lateral sides 75. Thereby, the second protection pillow 9 covers the trench lateral sides 75 in a plane parallel to the emitter side 22. Thus, the second protection pillow 9 is arranged like a closed ring around the trench gate electrode 7 close fitting (touching) the lateral sides 75 of the trench gate electrode 7, but it is also possible that the second protection pillow 9 covers the whole trench lateral sides 75, i.e. the second protection pillows 9 enwraps the lateral sides 75.

The second protection pillow 9 has a maximum doping concentration in a first depth 90, which is at least half the trench depth 77. Towards the direction of the emitter side 22, a doping concentration of the second protection pillow 9 decreases from the maximum doping concentration to a value of not more than half the maximum doping concentration of the second protection pillow 9.

Figure 11:
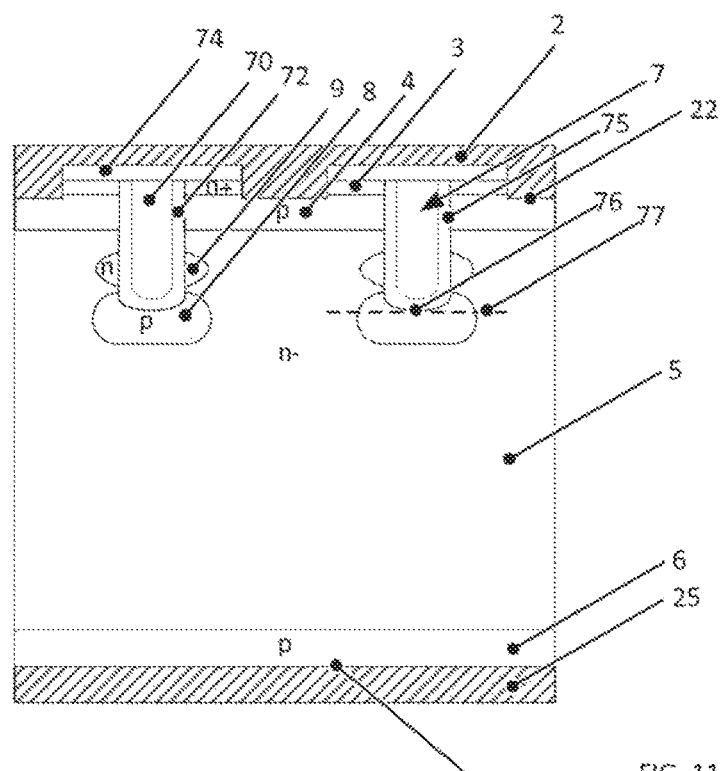
FIG. 11 shows an inventive IGBT having no enhancement layer.

In an exemplary embodiment, the inventive device may have a p doped base layer 4, which is directly in contact with the drift layer 5 (FIG. 11). Alternatively, an n doped enhancement layer 95 having higher doping concentration than the drift layer 5 may be arranged below the p doped base layer 4 such that the enhancement layer 95 separates the base layer 4 from the drift layer 5. The enhancement layer 95 may have a maximum doping concentration, which is lower than $3*10^{16}$ cm$^{-3}$, or lower than $2.5*10^{16}$ cm$^{-3}$ or lower than $2*10^{16}$ cm$^{-3}$. The enhancement layer 95 may have a maximum doping concentration of at least 20 times the (maximum) doping concentration of the drift layer 5. The enhancement layer 95 may have a thickness of less than 3 μm, exemplarily of less than 2 μm or of less than 1.5 μm.

The device shown in FIG. 2 and used for the other graphs has a maximum doping concentration for the first protection pillow 8 of $1*10^{17}$ cm$^{-3}$, for the second protection pillow 9 of $5*10^{16}$ cm$^{-3}$ and for the enhancement layer 95 of $2*10^{16}$ cm$^{-3}$.

Exemplarily, the maximum doping concentration of the enhancement layer 95 may be the same as of the second protection pillow 9. Thus, the enhancement layer 95 and the second protection pillow 9 can be distinguished by a local minimum in doping concentration in depth direction between the two layers, which doping concentration rises from the local minimum towards the emitter side 22 to the maximum doping concentration of the enhancement layer 95 and to greater depth to the maximum doping concentration of the second protection pillow 9.

Thus, the enhancement layer 8 and the second protection pillow 9 may be distinguished by the depth of a local n doping concentration minimum in depth direction (i.e. direction perpendicular to the emitter side 22) in between these layers. The local doping concentration minimum is lower than both of the doping concentration maximums of the enhancement layer 95 and the second protection pillow 9. Exemplarily, this local minimum doping concentration is at most half the maximum doping concentration of the second protection pillow 9. In an exemplary embodiment, the local minimum doping concentration is not more than half the maximum doping concentration of the enhancement layer 95 or not more than half the lower value of the maximum doping concentrations of the enhancement layer 95 and second protection pillow 9.

In another exemplary embodiment, the maximum doping concentration of the second protection pillow 9 is higher than the maximum doping concentration of the enhancement layer 95, e.g. at least a factor of 2 or 2.5 higher.

The doping concentration of the source layer 3 is higher than of the base layer 4. Exemplary doping concentrations for the source layer 3 higher than $1*10^{18}$ cm$^{-3}$ and smaller than $1*10^{21}$ cm$^{-3}$, exemplarily between $1*10^{19}$ cm$^{-3}$ and $5*10^{19}$ cm$^{-3}$.

The doping concentration of the base layer 4 and the drift layer 5 can be freely chosen due to the application needs and the rules for the doping concentrations given above. Exemplarily, the drift layer 5 has a constantly low doping concentration. Therein, the substantially constant doping concentration of the drift layer 5 means that the doping concentration is substantially homogeneous throughout the drift layer 5, however without excluding that fluctuations in the doping concentration within the drift layer 5 being in the order of a factor of one to five may be possibly present due to manufacturing reasons. The final drift layer thickness and doping concentration is chosen due to the application needs. For devices above 600 V the doping concentration of the drift layer is exemplarily below $5*10^{14}$ cm$^{-3}$. For power devices (voltage above 600 V) an exemplary doping concentration of the drift layer 5 is between $2*10^{12}$ cm$^{-3}$ and $5*10^{14}$ cm$^{-3}$.

The structures as described above form an active cell. The IGBT device may comprise only one active cell as disclosed above, but it is also possible that the device comprises at least two or more such active cells, i.e. the active cells can be repetitively arranged in one substrate.

The gate electrode 7 may have different design like a stripe design, i.e. having in a plane parallel to the emitter side 22 a short side and a long side perpendicular to the short side. The source layers 3 are arranged along the long sides of the gate electrode 7. Other designs for the trench gate electrode 7 are also possible like square design, circular design, ring design, hexagonal design, etc. The device may have one trench gate electrode 7 or it may comprise a plurality of gate electrodes 7 (i.e. two or more). Exemplarily, in the latter case the gate electrodes 7 are arranged in a regular geometrical design.

Figure 12:
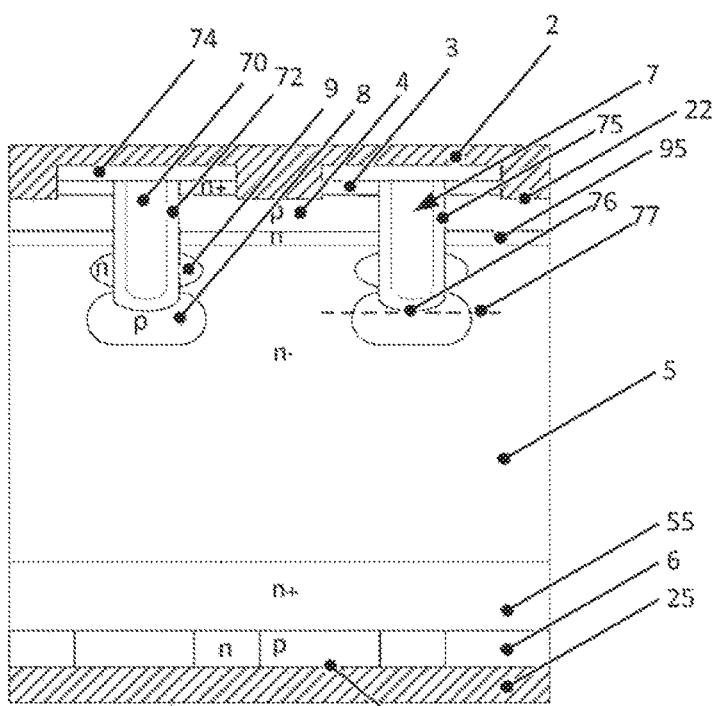
FIG. 12 shows an inventive reverse conducting IGBT.

The inventive protection pillow structure 8, 9 can be integrated into different semiconductor device types. In FIG. 2, the integration of the inventive protection pillows 8, 9 in an IGBT is shown. The inventive protection pillows 8, 9 can be integrated into IGBT variants like a reverse conducting IGBT (FIG. 12), in which on the collector side 27 the collector layer 6 is placed and in the same plane lateral to the collector layer 6 an n doped layer is arranged. Thus, the n doped layer alternates with the collector layer 6. Such devices are well-known to the experts in the field. The buffer layer 55 may be present in the inventive device, so that the device is a punch-through device, but alternatively, the inventive device may be designed such that the low doped drift layer 5 adjoins the collector layer 6 without having a higher n doped layer in between.

Figure 13:
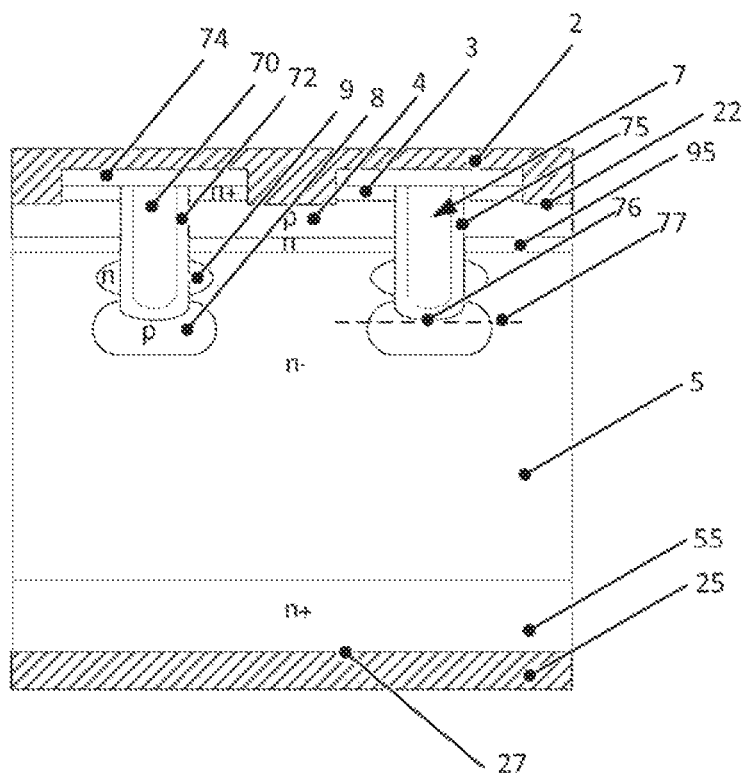
FIG. 13 shows an inventive MOSFET.

Furthermore, such inventive protection pillows 8, 9 can also be applied to MOSFETs (FIG. 13), in which an n doped layer layer 55 (which may also be called drain layer for the MOSFET) adjoins the collector electrode 25.

For manufacturing an inventive insulated gate power semiconductor device the following steps are performed for the creation of layers on the emitter side 22.

Figure 14:
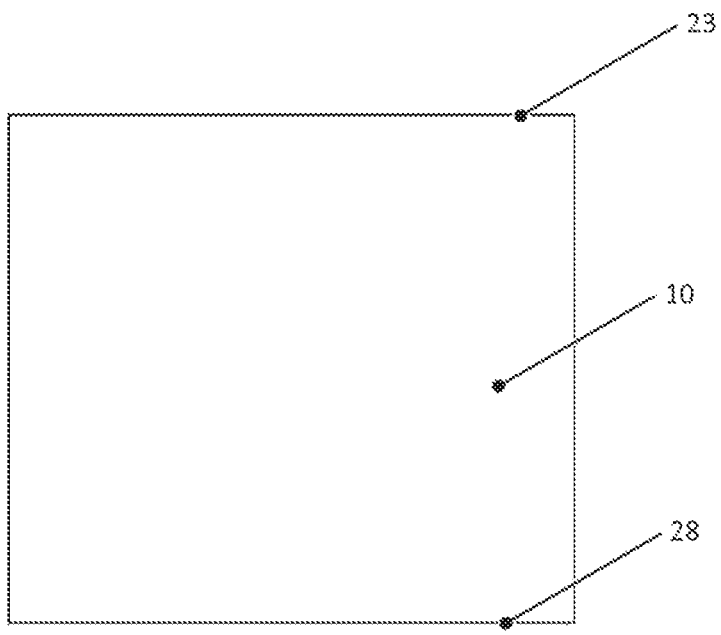
FIG. 14 to 20 shows different manufacturing steps for the manufacturing of an inventive device.

In step (a) an (n−) doped substrate 10 having a first and second side 23, 28 opposite to the first side 23 is provided (FIG. 14). The substrate 10 may be made on a basis of silicon. Such part of substrate having unamended doping concentration in the finalized device forms a drift layer 5. The first side 23 forms the emitter side 22 in the finalized device and the second side 28 forms the collector side 27.

Figure 15:
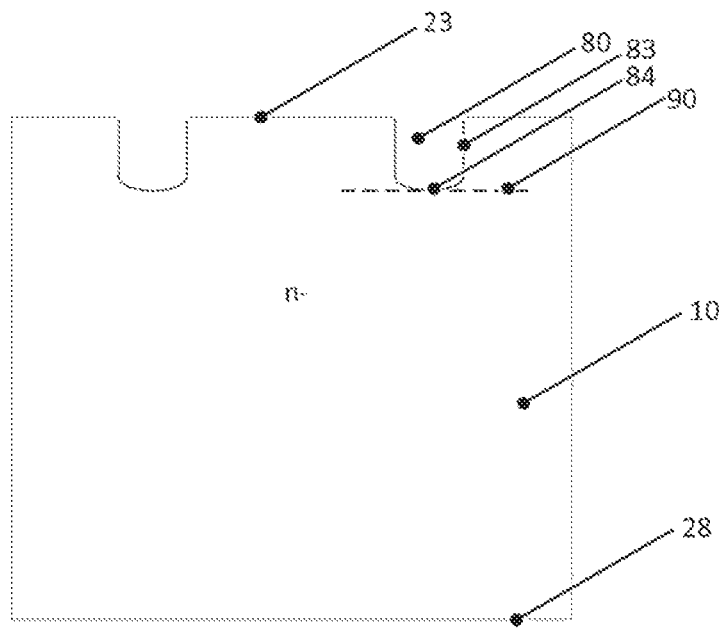

As shown in FIG. 15, in step (b) on the first side 23 a recess 80 is formed in the substrate 10 up to a first depth 90, which is at least half of a trench depth (77), wherein the recess 80 has lateral sides 83 perpendicular to the first side 23 and a first bottom 84 parallel to the first side 23.

Figure 16:
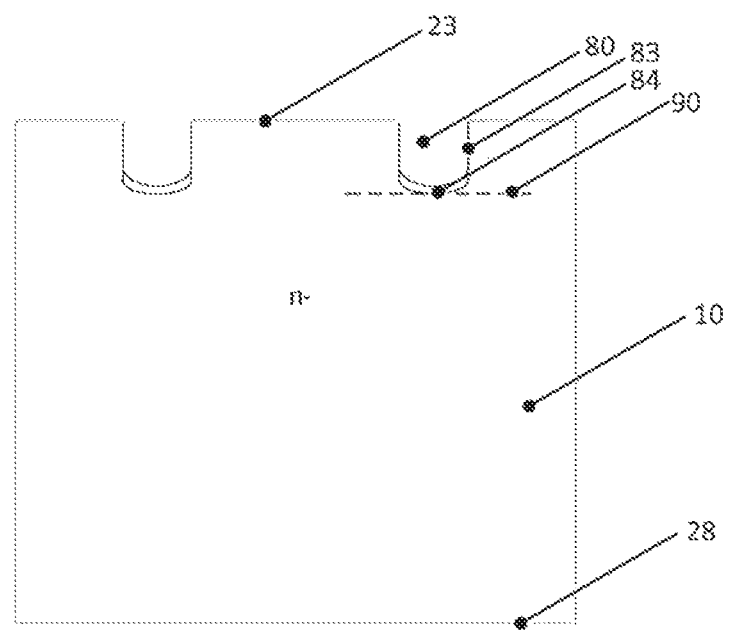
Figure 17:
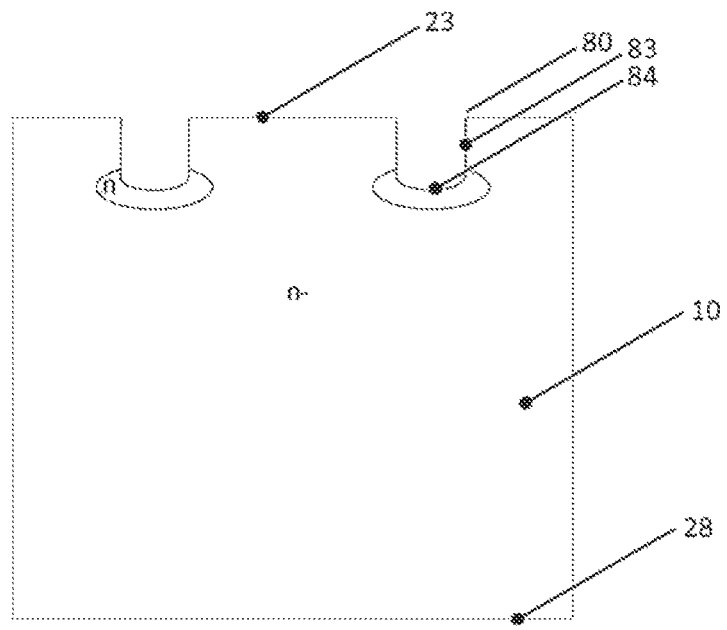

In step (c) an n dopant is implanted on the first side 23 such that the n dopant is applied at the bottom 84 of the recess 80 (FIG. 16). Afterwards, in step (d) a heating step is performed by which the n dopant diffuses into the substrate 10 (FIG. 17). A doping profile is created which decreases towards the first side 23 from a maximum doping concentration (at the first depth 90) to a value of not more than half the maximum doping concentration. Of course, the doping profile also decreases towards the second side 28.

Figure 18:
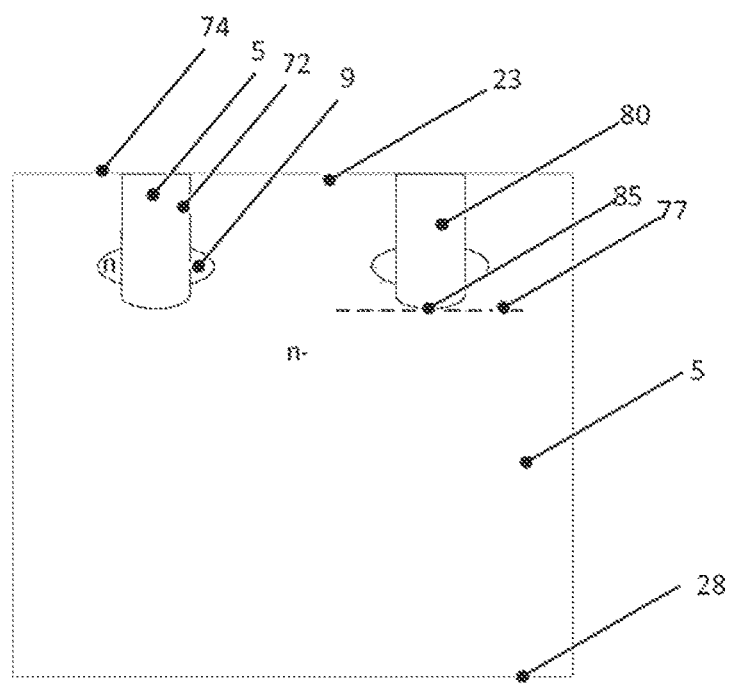

Then, as shown in FIG. 18, in step (e) the recess is deepened by further removing material in the recess 80 such that the depth of the recess is increased up to the trench depth 77. After the deepening of the recess, the recess has a second bottom 85, wherein the lateral sides 83 of the recess form the trench lateral sides 75 and the second bottom 85 forms the trench bottom 76. The remaining region, into which the n dopant has been diffused, forms a second protection pillow 9.

Figure 19:
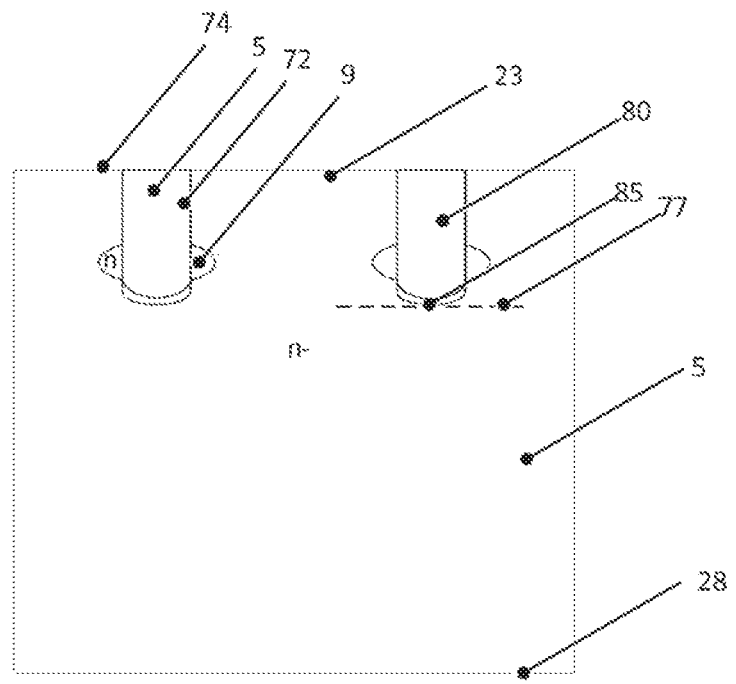
Figure 20:
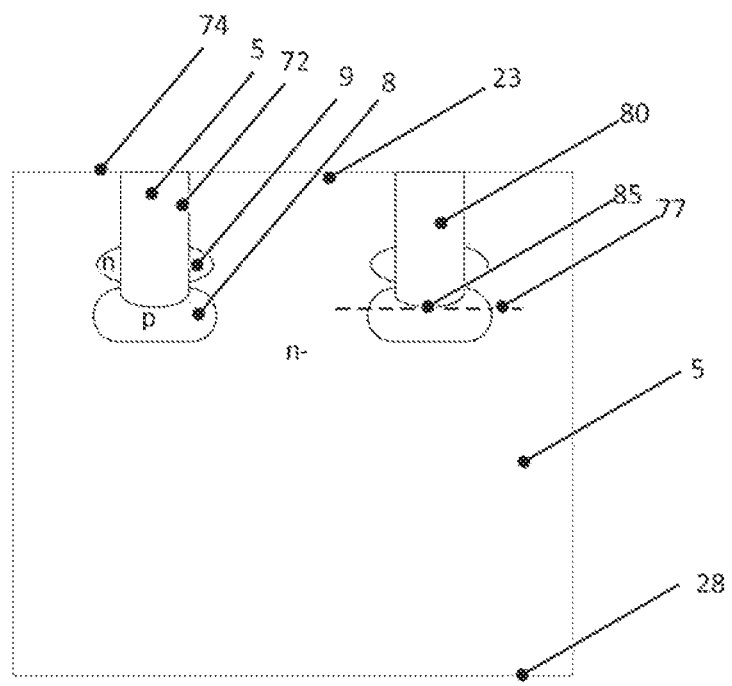

In step (f) a p dopant is implanted at the second bottom 85 after step (e) (FIG. 19). In step (g) the first protection pillow 8 is formed by diffusing the p dopant such that the first protection pillow 8 covers the second bottom 85 (FIG. 20) and exemplarily also the edge of the trench between the trench bottom 76 and the trench lateral sides 75.

In a further step (h), a p doped base layer 4 and an n doped source layer 3 (having higher doping concentration than the drift layer 5) is formed on the first side 23. For forming the base layer 4, a p dopant is applied on the first side 23. The p dopant is diffused into the substrate 10. Then an n type dopant is implanted into the substrate 10 on the first side 23 and annealed for the creation of the source layer 3. Afterwards, an etch step may be performed, by which in a central region between two gate electrodes 7, material is removed to a depth, in which the p dopant of the base layer 4 predominates to enable a contact from the emitter electrode 2 to the base layer 4.

This step may be performed after step (g), i.e. after having created the first and second protection pillow 9, 95, but it is also possible to create the base and/or source layer 4, 3 at any other appropriate manufacturing step, e.g. before creating the recess in step (b).

Additionally, an n doped enhancement layer 95 is formed, which separates the base layer 4 from the drift layer 5 in the finalized device (step (k)). For forming the enhancement layer 95, an n dopant is applied on the first side 23. The n dopant is diffused into the substrate 10. The enhancement layer 95 may be formed before forming the base layer 4, or it may also be formed simultaneously with or later than the base layer 4 (e.g. by using an n dopant which diffuses faster than the p dopant). Exemplarily, the enhancement layer 95 is formed as a contiguous layer. The enhancement layer 95 is arranged directly below the base layer 4 so that it separates the base layer 4 from the drift layer 5. The maximum doping concentration of the enhancement layer 95 is arranged in a second depth 97, which is lower than the first depth 90. Between the second depth 97 and the first depth 90, the n doping concentration has a local doping concentration minimum. That means that there is a local doping concentration minimum between the first and second depth 90, 97, which is lower than the maximum doping concentration of the enhancement layer 95 and the second protection pillow 9.

Figure 8:
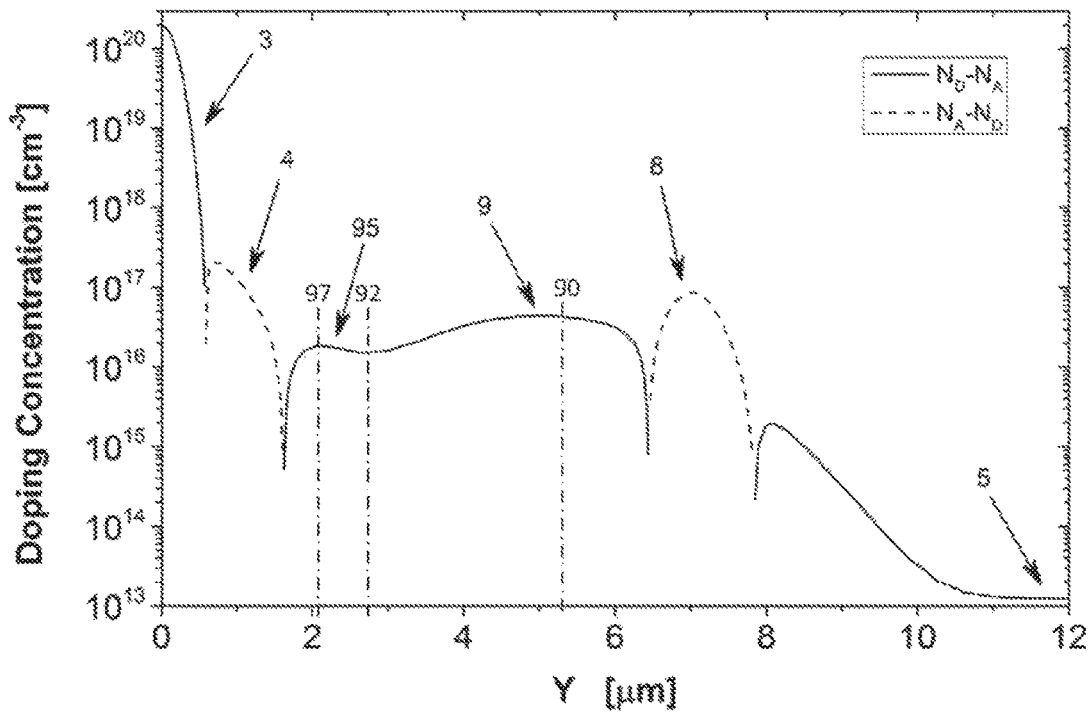
FIG. 8 shows the doping concentration profile of an inventive device along the line A-A of FIG. 2.
Figure 9:
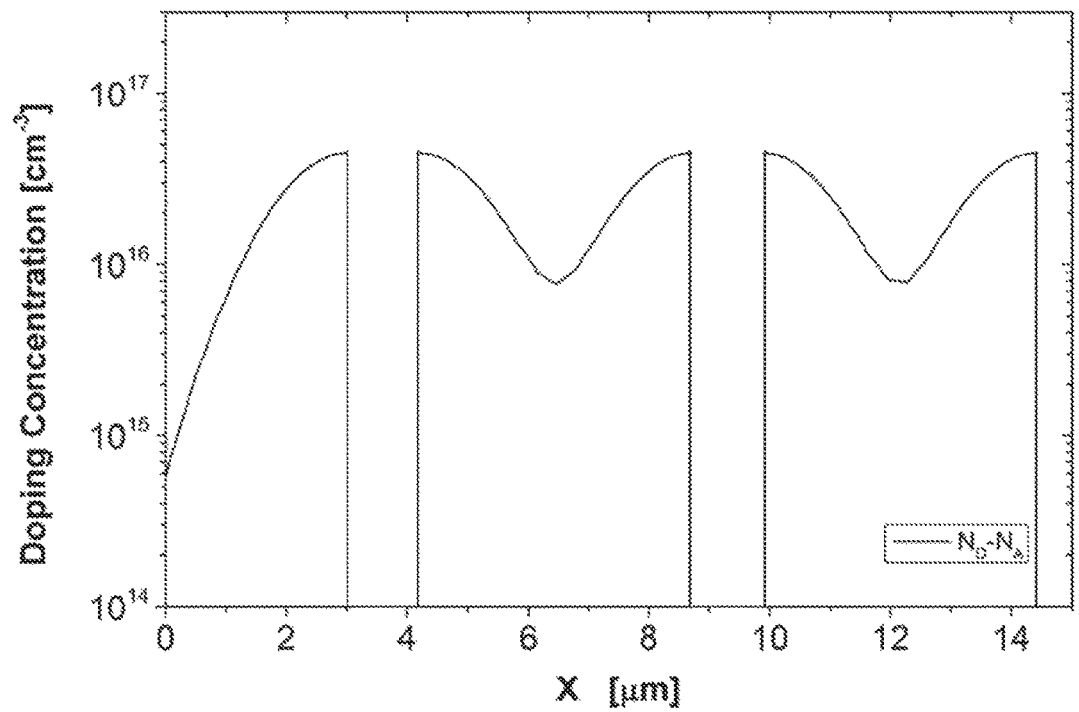
FIG. 9 shows the doping concentration profits of an inventive device along the line B-B of FIG. 2.
Figure 10:
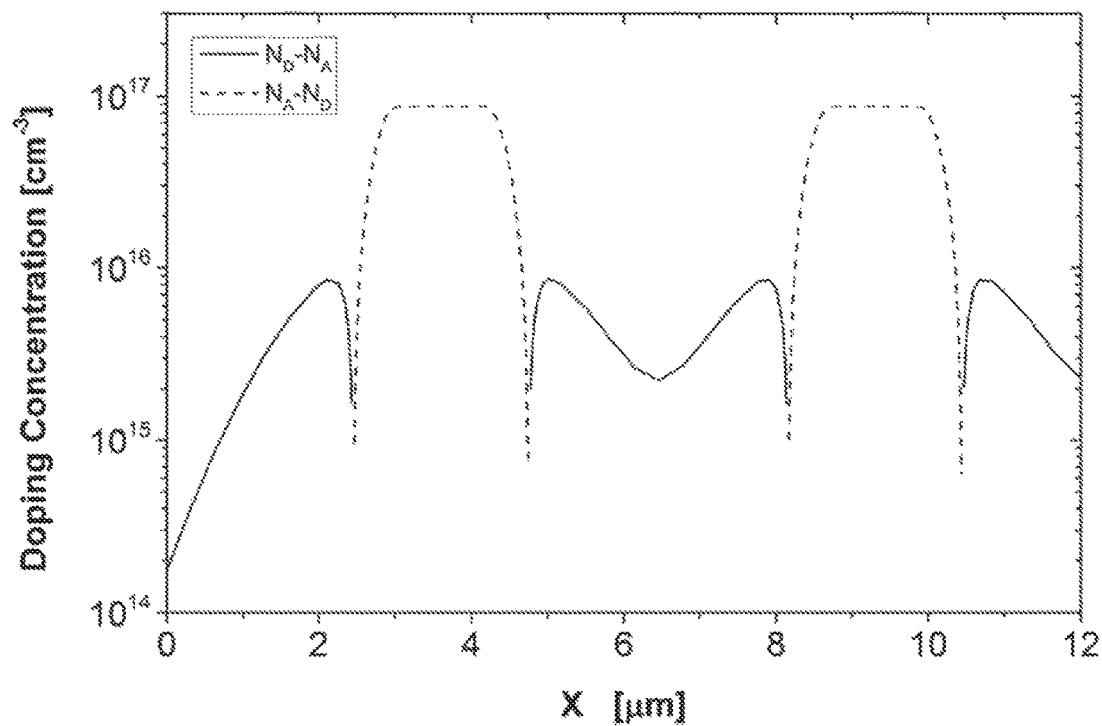
FIG. 10 shows the doping concentration profile of an inventive device along the line C-C of FIG. 2.

As shown in FIG. 8, the enhancement layer 95 has its maximum doping concentration in the second depth 97, which is closer to the emitter side 22 than the first depth 90, in which the second protection pillow 9 has its maximum doping concentration. Thus, the doping concentration of the n dopant in depth direction (in direction from the emitter side 22 towards the collector side 27) has a maximum in the second depth 97 close below the base layer 4, which then decreases in depth direction to a local minimum in a local minimum depth 92 and rises again to the maximum doping concentration of the second protection pillow 9 in the first depth 90. In an even greater depth is the maximum doping concentration of the first protection pillow 8.

Laterally from the trench gate electrode 7, i.e. in a plane parallel to the emitter side 22, the doping concentration of the enhancement layer 95 is exemplarily constant due to the creation of the enhancement layer 95 by applying, e.g. implanting a dopant on the emitter side 22, whereas the second protection pillow has a doping concentration maximum at the trench gate electrode 7, which decreases to the lateral sides due to the n dopant being applied in the trench recess 80 and by the diffusion the n doping concentration decreases with increasing distance from the n dopant source.

In step (i) a first electrically insulating gate layer 70 is formed in the recess 80 after step (e). The recess 80 is then filled with electrically conductive material thereby forming the gate layer 70 such that the electrically insulating gate layer 70 separates the gate layer 70 from the drift layer 5, the base layer 4 and the source layer 3. Thus, a trench gate electrode 7 is formed, which comprises the gate layer 70 and the first insulating layer 72, wherein the trench gate electrode 7 is arranged laterally to the base layer 4 in a plane parallel to the emitter side 22. The trench gate electrode 7 has a trench bottom 76 and trench lateral sides 75, wherein for a circular trench the circular side shall be regarded as lateral sides 75 in the sense of this patent application. This step i) may be performed prior or after step (f) or (g). It is also possible to create the gate electrode only partly (i.e. forming a first insulating layer 70 (e.g. in form of an oxide layer) and afterwards performing a step for the creation of the second protection pillow (step (f) and/or (g)) and afterwards creating the gate layer 70. That means that step (i) can be splitted in two steps with another manufacturing step (step (f) and/or (g)) being performed between the creation of the first insulating layer 80 and the gate layer 70.

Afterwards, an emitter electrode 2 is formed on the first side 23, which contacts the base layer 4 and the source layer 3. On the second side 28 a collector electrode 25 is formed, which contacts the doped layer on the second side 28 (i.e. the collector layer for an IGBT or the drain layer for a MOSFET). On the second side 28, a p type dopant is implanted and annealed for the creation of the collector layer 6. Also this step may be performed at any appropriate manufacturing step.

The doping concentrations and diffusion processes may be chosen such that the maximum doping concentration of the second protection pillow 9 is higher than the maximum doping concentration of the enhancement layer 95 in the finalized device. In a further exemplary embodiment, the doping concentration of the second protection pillow 9 decreases towards the emitter side 22 to a value of not more than half the maximum doping concentration of the enhancement layer 95 in the finalized device.

In another alternative embodiment, the maximum doping concentrations of the second protection pillow 9 and enhancement layer 8 may be the same.

The layers on the collector side 27 of the device and the trench gate electrode 7 may be made by methods well known to the experts (e.g. as described in this application in the prior art section for EP 0 795 911 A2) and finally, after all layers have been created in the substrate 10, the electrodes 2, 25 are applied as metal layers on both sides of the substrate.

These examples shall not limit the scope of the invention. The above mentioned designs and arrangements are just examples for any kinds of possible designs and arrangements for the protection pillow(s).

In another embodiment, the conductivity types are switched, i.e. all layers of the first conductivity type are p type (e.g. the drift layer 5, the source layer 3) and all layers of the second conductivity type are n type (e.g. base layer 4, the collector layer 6).

It should be noted that the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST 1 inventive IGBT
10 substrate
2 emitter electrode
22 emitter side
23 first side
25 collector electrode
27 collector side
28 second side
3 source layer
4 base layer
5 drift layer
55 buffer layer
6 collector layer
7 trench gate electrode
70 gate layer first insulating layer
72 first insulating layer
74 second insulating layer
75 trench lateral side
76 trench bottom
77 trench depth
8 first protection pillow
80 recess
83 lateral sides
84 first bottom
85 second bottom
9 second protection pillow
90 first depth
92 local doping concentration minimum depth
95 enhancement layer
97 second depth

The invention claimed is:

1. A method for manufacturing an insulated gate power semiconductor device comprising substrate of a first conductivity type having a first side and second side opposite to the first side, such part of substrate having unamended doping concentration in the finalized device forming a drift layer, wherein the first side forms the emitter side and the second side forms the collector side in the finalized device, the method comprises the following steps:
 (a) on the first side forming a recess in the substrate up to a first depth, which recess has lateral sides and a first bottom, which is at least half of a trench depth,
 (b) applying a dopant of the first conductivity type at the first bottom,
 (c) performing a heating step so that the dopant of the first conductivity type diffuses into the substrate, such that a first conductivity doping concentration decreases towards the first side from a maximum doping concentration to a value of not more than half the maximum doping concentration,
 (d) removing material from the substrate in the recess such that the depth of the recess is increased up to the trench depth, wherein the recess has a second bottom, wherein the lateral sides of the recess form the trench lateral sides and the second bottom forms a trench bottom, wherein the remaining region, into which the dopant of the first conductivity type has been diffused in step (c), forms a second protection pillow,
 (e) applying a dopant of the second conductivity type, which is different from the first conductivity type, at the second bottom after step (d),
 (f) forming a first protection pillow by diffusing the dopant of the second conductivity type such that the first protection pillow covers the second bottom (85),
 (g) forming a base layer of the second conductivity type and a source layer of the first conductivity type on the first side,
 (h) forming a first electrically insulating gate layer in the recess after step (f) and filling the recess with electrically conductive material thereby forming the gate layer, wherein a trench gate electrode comprises the gate layer and the first insulating layer,
 (i) forming an emitter electrode on the first side, which contacts the base layer and the source layer, and a collector electrode on the second side, and
 (j) forming an enhancement layer of the first conductivity type, which separates the base layer from the drift layer in the finalized device, in or before step (g), wherein the enhancement layer has a maximum doping concentration in a second depth, which is lower than the first depth and wherein the doping concentration has a local doping concentration minimum between the second depth and the first depth.

2. The method according to claim 1, wherein performing step (g) occurs after step (f).

3. The method according to claim 1, wherein the device is one of a MOSFET, an IGBT or a reverse conducting IGBT.

4. The method according to claim 1, wherein the local doping concentration minimum is at most half the maximum doping concentration of the enhancement layer in the finalized device.

5. The method according to claim 4, wherein performing step (g) occurs after step (f).

6. The method according to claim 1, wherein the maximum doping concentration of the second protection pillow is higher than the maximum doping concentration of the enhancement layer in the finalized device.

7. The method according to claim 6, wherein the local doping concentration minimum is at most half the maximum doping concentration of the enhancement layer in the finalized device.

8. The method according to claim 6, wherein performing step (g) occurs after step (f).

9. The method according to claim 6, wherein the maximum doping concentration of the second protection pillow is at least a factor of two higher than the maximum doping concentration of the enhancement layer.

10. The method according to claim 9, wherein the local doping concentration minimum is at most half the maximum doping concentration of the enhancement layer in the finalized device.

11. The method according to claim 9, wherein performing step (g) occurs after step (f).

12. An insulated gate power semiconductor device comprising:
   an emitter electrode on an emitter side and a collector electrode on a collector side, the collector side is arranged opposite to the emitter side,
   a drift layer of a first conductivity type, which is arranged between the emitter side and the collector side,
   a base layer of a second conductivity type, which is different from the first conductivity type, the base layer is arranged between the drift layer and the emitter side, and the base layer contacts the emitter electrode,
   a source layer, which is arranged on the emitter side, which is separated from the drift layer by the base layer and which contacts the emitter electrode,
   a trench gate electrode comprising an electrically conductive gate layer and a first electrically insulating layer, which surrounds and thus separates the gate layer from the drift layer, the base layer and the source layer, the trench gate electrode has a trench bottom and trench lateral sides and the trench gate electrode extends from the emitter side up to a trench depth,
   a first protection pillow of the second conductivity type, which covers the trench bottom,
   a second protection pillow of the first conductivity type having higher doping concentration than the drift layer, which encircles the trench gate electrode at the trench lateral sides and the second protection pillow has a maximum doping concentration in a first depth, which is at least half the trench depth, wherein a doping concentration of the second protection pillow decreases towards the emitter side from the maximum doping concentration to a value of not more than half the maximum doping concentration of the second protection pillow,
   an enhancement layer of the first conductivity type having higher doping concentration than the drift layer, which separates the base layer from the drift layer, wherein the enhancement layer has a maximum doping concentration in a second depth, which is lower than the first depth and wherein the doping concentration has a local doping concentration minimum between the second depth and the first depth.

13. The insulated gate power semiconductor device according to claim 12, wherein the maximum doping concentration of the second protection pillow is higher than the maximum doping concentration of the enhancement layer.

14. The insulated gate power semiconductor device according to claim 13, wherein the maximum doping concentration of the second protection pillow is at least a factor of two higher than the maximum doping concentration of the enhancement layer.

15. The insulated gate power semiconductor device according to claim 12, wherein the enhancement layer has a maximum doping concentration, which is lower than $3*10^{16}$ cm$^{-3}$.

16. The insulated gate power semiconductor device according to claim 12, wherein the doping concentration of the second protection pillow decreases towards the emitter side to a value of not more than half the maximum doping concentration of the enhancement layer (95).

17. The insulated gate power semiconductor device according to claim 12, wherein the enhancement layer has a thickness of less than 3 μm.

18. The insulated gate power semiconductor device according to claim 12, wherein the device is a MOSFET.

19. The insulated gate power semiconductor device according to claim 12, wherein the device is an IGBT.

20. The insulated gate power semiconductor device according to claim 12, wherein the device is a reverse conducting IGBT.

* * * * *